United States Patent
Lee et al.

(10) Patent No.: US 9,082,638 B2
(45) Date of Patent: Jul. 14, 2015

(54) SEMICONDUCTOR DEVICE WITH CROSS-TALK ISOLATION USING M-CAP

(75) Inventors: YongTaek Lee, Seoul (KR); Gwang Kim, Ichon si (KR); ByungHoon Ahn, KyungKi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/572,517

(22) Filed: Aug. 10, 2012

(65) Prior Publication Data

US 2012/0299149 A1 Nov. 29, 2012

Related U.S. Application Data

(63) Continuation of application No. 12/051,253, filed on Mar. 19, 2008, now Pat. No. 8,269,308.

(51) Int. Cl.
*H01L 29/00* (2006.01)
*H01L 27/08* (2006.01)
*H01L 49/02* (2006.01)
*H01L 23/522* (2006.01)
*H01L 27/12* (2006.01)

(52) U.S. Cl.
CPC ............ *H01L 27/08* (2013.01); *H01L 23/5225* (2013.01); *H01L 28/10* (2013.01); *H01L 28/20* (2013.01); *H01L 28/40* (2013.01); *H01L 23/5223* (2013.01); *H01L 27/1203* (2013.01); *H01L 2924/0002* (2013.01); *H01L 2924/3011* (2013.01)

(58) Field of Classification Search
CPC ...... H01L 2924/00; H01L 21/02; H01L 27/08
USPC ........... 257/528, E27.046, E21.003, 531, 532
See application file for complete search history.

(56) References Cited

U.S. PATENT DOCUMENTS

| | | | |
|---|---|---|---|
| 5,196,920 A * | 3/1993 | Kumamoto et al. ........... 257/798 |
| 5,370,766 A * | 12/1994 | Desaigoudar et al. .......... 216/13 |
| 5,442,347 A * | 8/1995 | Vranish .................... 340/870.37 |
| 5,450,263 A * | 9/1995 | Desaigoudar et al. ........ 360/110 |
| 5,689,138 A * | 11/1997 | Dekker et al. ................. 257/728 |
| 5,788,854 A * | 8/1998 | Desaigoudar et al. .......... 216/13 |
| 5,880,024 A * | 3/1999 | Nakajima et al. ............. 438/669 |
| 6,037,621 A * | 3/2000 | Wilson .......................... 257/296 |
| 6,444,920 B1 | 9/2002 | Klee et al. |
| 6,472,285 B1 | 10/2002 | Liou |
| 6,472,723 B1 * | 10/2002 | Jarstad et al. ................. 257/659 |
| 6,534,374 B2 * | 3/2003 | Johnson et al. ............... 438/381 |
| 6,876,056 B2 * | 4/2005 | Tilmans et al. ............... 257/528 |

(Continued)

*Primary Examiner* — Caleb Henry

(74) *Attorney, Agent, or Firm* — Robert D. Atkins; Patent Law Group: Atkins and Associates, P.C.

(57) ABSTRACT

A semiconductor device is made by forming an oxide layer over a substrate and forming a first conductive layer over the oxide layer. The first conductive layer is connected to ground. A second conductive layer is formed over the first conductive layer as a plurality of segments. A third conductive layer is formed over the second conductive layer as a plurality of segments. If the conductive layers are electrically isolated, then a conductive via is formed through these layers. A first segment of the third conductive layer operates as a first passive circuit element. A second segment operates as a second passive circuit element. A third segment is connected to ground and operates as a shield disposed between the first and second segments. The shield has a height at least equal to a height of the passive circuit elements to block cross-talk between the passive circuit elements.

20 Claims, 5 Drawing Sheets

(56) References Cited

U.S. PATENT DOCUMENTS

| | | | |
|---|---|---|---|
| 6,924,725 B2* | 8/2005 | Bueyuektas et al. | 336/223 |
| 7,013,436 B1* | 3/2006 | Morton et al. | 257/532 |
| 7,132,747 B2 | 11/2006 | Kwon et al. | |
| 7,199,679 B2 | 4/2007 | Mondal | |
| 7,259,077 B2* | 8/2007 | Degani et al. | 438/381 |
| 7,305,223 B2* | 12/2007 | Liu et al. | 455/333 |
| 7,335,955 B2* | 2/2008 | Mitra et al. | 257/355 |
| 7,355,264 B2* | 4/2008 | Degani et al. | 257/531 |
| 7,619,297 B2 | 11/2009 | Wang | |
| 7,868,393 B2* | 1/2011 | Huang et al. | 257/379 |
| 7,973,246 B2* | 7/2011 | Kuwajima | 174/261 |
| 7,994,609 B2* | 8/2011 | Quinn | 257/532 |
| 2002/0171529 A1 | 11/2002 | Tang | |
| 2002/0197844 A1* | 12/2002 | Johnson et al. | 438/618 |
| 2003/0122637 A1* | 7/2003 | Chiu | 333/238 |
| 2003/0231098 A1* | 12/2003 | Wan | 338/32 H |
| 2004/0032308 A1 | 2/2004 | Cheung et al. | |
| 2004/0080021 A1 | 4/2004 | Casper et al. | |
| 2004/0090406 A1* | 5/2004 | Lin et al. | 345/87 |
| 2004/0104449 A1* | 6/2004 | Yoon et al. | 257/528 |
| 2004/0178472 A1* | 9/2004 | Zhang et al. | 257/531 |
| 2004/0195692 A1* | 10/2004 | Adan | 257/758 |
| 2004/0222478 A1* | 11/2004 | Zhang et al. | 257/422 |
| 2004/0238934 A1* | 12/2004 | Warner et al. | 257/686 |
| 2005/0034885 A1* | 2/2005 | Groves et al. | 174/35 R |
| 2005/0037611 A1* | 2/2005 | Pon | 438/637 |
| 2005/0077592 A1 | 4/2005 | Hsieh | |
| 2005/0242377 A1* | 11/2005 | Eguchi et al. | 257/240 |
| 2005/0253255 A1* | 11/2005 | Degani et al. | 257/724 |
| 2006/0061935 A1* | 3/2006 | Schultz et al. | 361/306.1 |
| 2006/0113645 A1* | 6/2006 | Warner et al. | 257/676 |
| 2006/0217102 A1* | 9/2006 | Degani et al. | 455/333 |
| 2006/0255434 A1* | 11/2006 | Degani et al. | 257/659 |
| 2007/0013036 A1* | 1/2007 | Zhe et al. | 257/659 |
| 2007/0065964 A1* | 3/2007 | Degani | 438/48 |
| 2007/0114634 A1* | 5/2007 | Lin et al. | 257/528 |
| 2007/0114651 A1* | 5/2007 | Marimuthu et al. | 257/690 |
| 2007/0176287 A1* | 8/2007 | Crowley et al. | 257/728 |
| 2007/0217174 A1* | 9/2007 | Shen | 361/760 |
| 2007/0235878 A1* | 10/2007 | Lin et al. | 257/773 |
| 2007/0241695 A1* | 10/2007 | Chang | 315/312 |
| 2007/0253144 A1* | 11/2007 | Kuwajima | 361/311 |
| 2008/0012097 A1* | 1/2008 | Takahashi et al. | 257/659 |
| 2008/0061405 A1* | 3/2008 | Degani et al. | 257/659 |
| 2008/0136574 A1 | 6/2008 | Jow et al. | |
| 2008/0246114 A1 | 10/2008 | Abrokwah et al. | |
| 2009/0102464 A1* | 4/2009 | Doogue et al. | 324/207.21 |
| 2010/0059853 A1* | 3/2010 | Lin et al. | 257/528 |

* cited by examiner

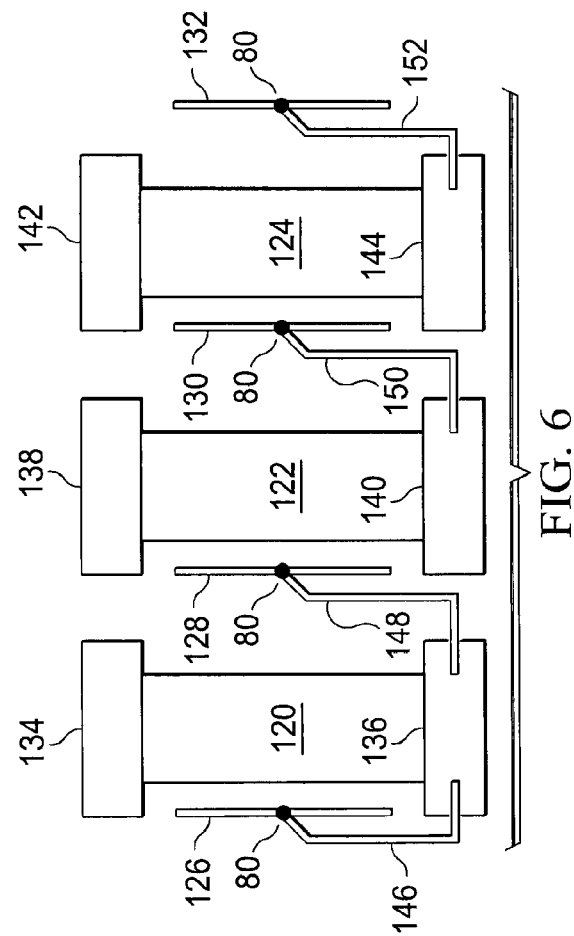
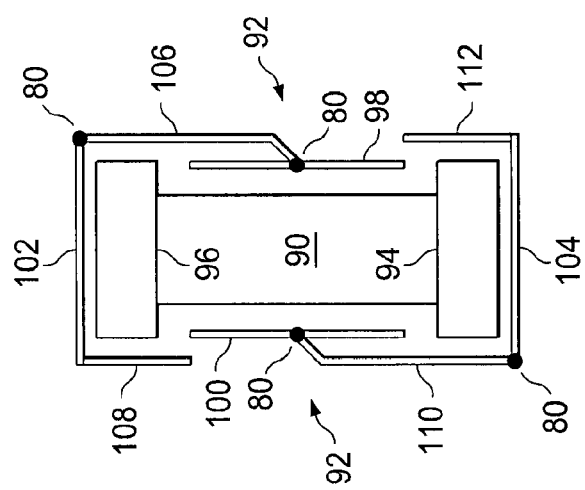

SEMICONDUCTOR DEVICE WITH CROSS-TALK ISOLATION USING M-CAP

CLAIM TO DOMESTIC PRIORITY

The present application is a continuation of U.S. patent application Ser. No. 12/051,253, filed Mar. 19, 2008, now U.S. Pat. No. 8,269,308,which application is incorporated herein by reference.

FIELD OF THE INVENTION

The present invention relates in general to semiconductor devices and, more particularly, to a semiconductor device having integrated passive devices separated by shielding to block cross-talk.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. In some applications, flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In high frequency applications, such as radio frequency (RF) wireless communications, integrated passive devices (IPD) are often contained within the semiconductor device. Examples of IPDs include resistors, capacitors, and inductors. A typical RF system requires multiple IPDs in one or more semiconductor packages to perform the necessary electrical functions. However, most IPDs generate undesired capacitive, inductive, or conductive coupling, also known as cross-talk, which can interfere with the operation of adjacent circuit elements.

FIG. 1 illustrates a conventional semiconductor device 10 having substrate 12 with adjacent IPDs. Conduction channels 14 and 16 represent a portion of the adjacent IPDs. A signal in channel 14 can induce cross-talk in channel 16 by conductive coupling shown by arrow 20, magnetic field coupling shown by arrows 22, electric field coupling shown by arrows 24, or capacitive coupling shown by arrows 26. The cross-talk generated by one IPD can interfere with the operation of adjacent IPDs.

SUMMARY OF THE INVENTION

A need exists to eliminate cross-talk between adjacent IPDs. Accordingly, in one embodiment, the present invention is a method of making a semiconductor device comprising the steps of providing a substrate, forming a first passive circuit element over the substrate, forming a second passive circuit element over the substrate, and forming a shielding layer over the substrate between the first passive circuit element and second passive circuit element. The shielding layer includes a height smaller than or greater than a height of the first passive circuit element and second passive circuit element to reduce interference and thermal emission between the first passive circuit element and second passive circuit element.

In another embodiment, the present invention is a method of making a semiconductor device comprising the steps of providing a substrate, forming a first passive circuit element over the substrate, forming a second passive circuit element over the substrate, and forming a shielding layer over the substrate between the first passive circuit element and second passive circuit element to reduce interference and thermal emission between the first passive circuit element and second passive circuit element.

In another embodiment, the present invention is a method of making a semiconductor device comprising the step of providing a substrate, forming an M-cap layer over the substrate, forming a first passive circuit element over the substrate, forming a second passive circuit element over the M-cap layer, and forming a shielding layer over the M-cap layer between the first passive circuit element and second passive circuit element.

In another embodiment, the present invention is a semiconductor device comprising a substrate, first passive circuit element formed over the substrate, and second passive circuit element formed over the substrate. A shielding layer is formed over the substrate between the first passive circuit element and second passive circuit element to reduce interference and thermal emission between the first passive circuit element and second passive circuit element.

BRIEF DESCRIPTION OF THE DRAWINGS

FIG. 5 illustrates a passive circuit element isolated with a shield; and

FIG. 6 illustrates a plurality of passive circuit elements isolated by a plurality of shields.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
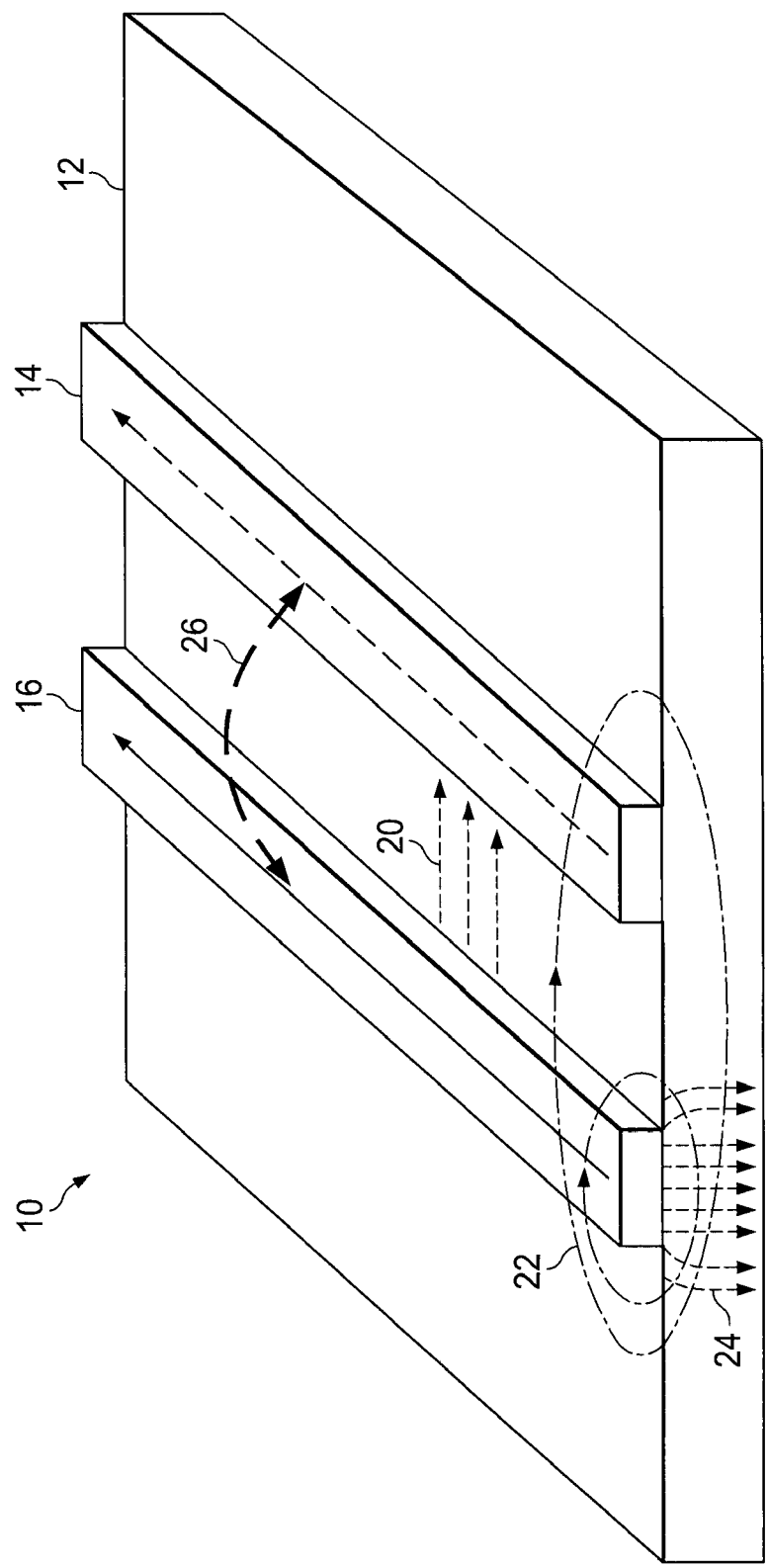
FIG. 1 is a conventional semiconductor device with adjacent passive circuit elements each generating interfering cross-talk.
Figure 2:
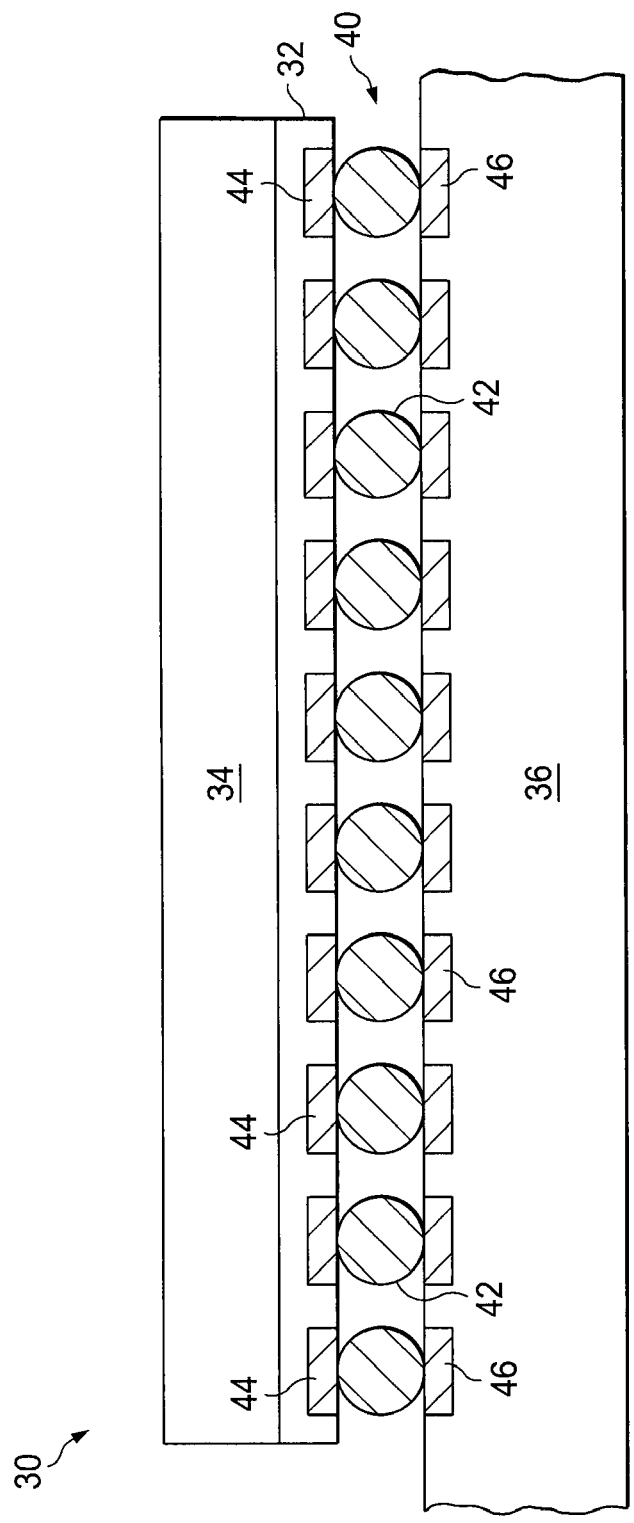
FIG. 2 is a semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Semiconductor device 30 involves mounting an active area 32 of die 34 facedown toward a chip carrier substrate or printed circuit board (PCB) 36, as shown in FIG. 2. Active area 32 contains active and passive devices, conductive layers, and dielectric layers according to the electrical design of the die. The electrical and mechanical interconnect is achieved through a solder bump structure 40 comprising a large number of individual conductive solder bumps or balls 42. The solder bumps are formed on bump pads or interconnect sites 44, which are disposed on active area 32. The bump pads 44 connect to the active circuits by conduction tracks in active area 32. The solder bumps 42 are electrically and mechanically connected to contact pads or interconnect sites 46 on carrier substrate 36 by a solder reflow process. The semiconductor device provides a short electrical conduction path from the active devices on die 34 to conduction tracks on carrier substrate 36 in order to reduce signal propagation, lower capacitance, and achieve overall better circuit performance.

Figure 3A:
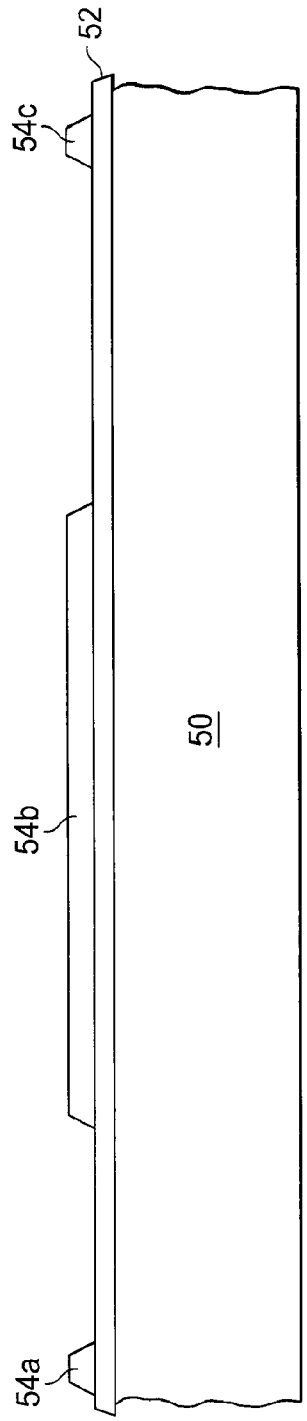
FIGS. 3a-3b illustrate a process of forming a shield between two passive circuit elements using a grounded M-cap layer.
Figure 3B:
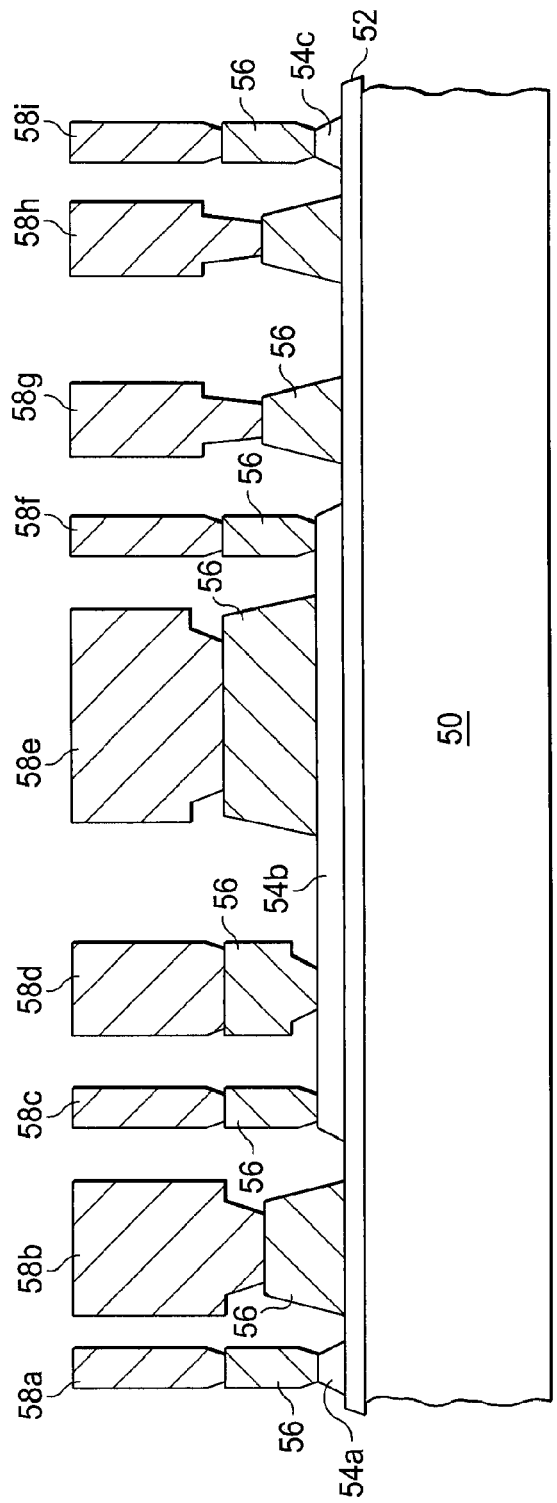

FIGS. 3a-3b illustrate a process of forming a semiconductor device having cross-talk isolation using a method capacitor (M-cap) base layer. In FIG. 3a, a substrate 50 is made with silicon, gallium arsenide, or other bulk semiconductor material for structural support. Substrate 50 has a high resistivity, on the order of 1 k ohms/cm or greater. The surface of substrate 50 is implanted with oxide to suppress surface conduction. Substrate 50 also includes solder bumps, wire bonds, and internal conductive layers for external electrical interconnect. An oxide layer 52 is formed on the surface of substrate 50. Oxide layer 52 can be made with silicon dioxide ($SiO_2$), silicon oxynitride (SiON), tantalum pentoxide ($Ta_2O_5$), zinc oxide (ZnO), or other material having insulating properties. Oxide layer 52 is about 0.1 microns in thickness and can be formed by a physical vapor deposition (PVD), chemical vapor deposition (CVD), or sputtering process.

An electrically conductive layer 54 is patterned and deposited over oxide layer 52 using a PVD, CVD, evaporation, sputtering, electrolytic plating, electroless plating, or screen printing process. Conductive layer 54 is about 1 micron in thickness and can be made with aluminum (Al), aluminum alloy, copper (Cu), tin (Sn), nickel (Ni), gold (Au), silver (Ag), or other electrically conductive material. In one embodiment, conductive layer 54 is Al. Conductive layer 54 is an M-cap layer having multiple portions 54a, 54b, and 54c. M-cap layer 54 is connected to a low impedance ground point.

In FIG. 3b, an intermediate electrically conductive layer 56 is patterned and deposited over oxide layer 52 and M-cap layer 54 using a PVD, CVD, evaporation, sputtering, electrolytic plating, electroless plating, or screen printing process. Conductive layer 56 is about 2 microns in thickness and can be made with Al, Cu, Sn, Ni, Au, Ag, or other electrically conductive material. Conductive layer 56 is shown with a plurality of portions or segments which can be electrically common or electrically isolated depending on the connectivity of the semiconductor die.

A top electrically conductive layer 58 is patterned and deposited over intermediate conductive layer 56 using a PVD, CVD, evaporation, sputtering, electrolytic plating, electroless plating, or screen printing process. Conductive layer 58 is about 8 microns in thickness and can be made with Al, Cu, Sn, Ni, Au, Ag, or other electrically conductive material. In one embodiment, conductive layer 56 is Al and conductive layer 58 is Cu.

Conductive layer 58 has individual portions or segments 58a-58i. The individual portions of conductive layers 58a-58i can be electrically common or electrically isolated depending on the connectivity of the semiconductor die. The individual conductive layers 58a-58i are part of an interconnect structure and can form one or more IPDs. For example, conductive layers 58d and 58e form a portion (bottom electrode) of a metal-insulator-metal (MIM) capacitor, and conductive layers 58g and 58h constitute a spiral inductor. The conductive layers 58g-58h are typically coiled or wound in plan-view to produce or exhibit the desired inductive properties. Conductive layer 58b is a signal trace in the interconnect structure. Conductive layers 58a, 58c, 58f, and 58i are isolation metal layers connected to grounded M-cap layer 54. The conductive layers 58a-58i can also form portions of resistors and active circuits.

The IPDs provide the electrical characteristics needed for high frequency applications, such as high-pass filters, low-pass filters, band-pass filters, symmetric Hi-Q resonant transformer, and tuning capacitors. The IPDs can be used as front-end wireless RF components, which can be positioned between the antenna and transceiver. The inductor 58g and 58h can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. By arranging the baluns side-by-side on the same substrate, the balun spacing can be reduced to 100-150 microns or less which provides minimal impact on phase and amplitude performance over the frequency bands of operation. The minimal spacing also reduces the size and cost of baluns for multi-band operation.

However, positioning the IPDs in close proximity, e.g., 100-150 microns spacing or less, often causes interference between adjacent passive circuit elements. The output signal in the transmitter section of the radio frequency integrated circuit (RFIC) may interfere with the local oscillator (LO). The inductor 58g and 58h can be used in the tank resonators of the LO in the RF transceiver. The LO includes a voltage-controlled oscillator (VCO) that is synchronized to an external crystal reference through a phase-locked loop (PLL). The VCO can be implemented as a cross-coupled amplifier circuit with a tuned resonant inductor-capacitor (LC) load. The inductor is made with one or two spiral inductor coils on the RFIC. External signals can couple into the VCO by magnetic induction directly into the tank resonator. If the external source is a periodic or quasi-periodic signal, it will introduce a spurious tone. In subsequent mixing, the RF signal is multiplied by the LO signal to transpose the band of interest down to low frequency for further signal processing. The presence of the spurious tone in the LO often causes out-of-band signals to be mixed into the base-band frequency range, which degrades the receiver sensitivity, adding both noise and crosstalk to the received signal. Therefore, each of these passive circuit elements has the potential to interfere with adjacent devices.

As a feature of the present invention, the conductive layer stack including M-cap layer 54a, conductive layer 56, and conductive layer 58a is a first grounded shield. The conductive layer stack including M-cap layer 54b, conductive layer 56, and conductive layer 58c is a second grounded shield. The conductive layer stack including M-cap layer 54b, conductive layer 56, and conductive layer 58f is a third grounded shield. The conductive layer stack including M-cap layer 54c, conductive layer 56, and conductive layer 58i is a fourth grounded shield. The grounded shields isolate each circuit element from cross-talk generated by the adjacent circuit element. The cross-talk may be in the form of conductive coupling, inductive coupling, magnetic field coupling, electric field coupling, or capacitive coupling depending on the electrical nature of the adjacent device. For example, the second shield 54b, 56, 58c isolates signal trace 58b from capacitive coupling and electric field coupling from capacitors 58d and 58e. The second shield 54b, 56, 58c also isolates capacitors 58d and 58e from conductive coupling from signal trace 58b. In a similar manner, the third shield 54b, 56, 58f isolates capacitors 58d and 58e from inductive coupling and magnetic field coupling from inductor 58g and 58h. The second shield 54b, 56, 58c also isolates inductor 58g and 58h from capacitive coupling and electric field coupling from capacitors 58d and 58e.

Each grounded shield is made approximately the same height as the adjacent circuit element which is generating the cross-talk to be shielded. Alternatively, the grounded shield can be made higher than the adjacent circuit element which is generating the cross-talk to be shielded. Each circuit element is thus isolated from any cross-talk generated by the adjacent circuit element with the shield formed by the respective conductive layers 54, 56, and 58. In one embodiment, the grounded shield can provide less than −20 dB of isolation, given IPD spacing of 100-150 microns.

Figure 4:
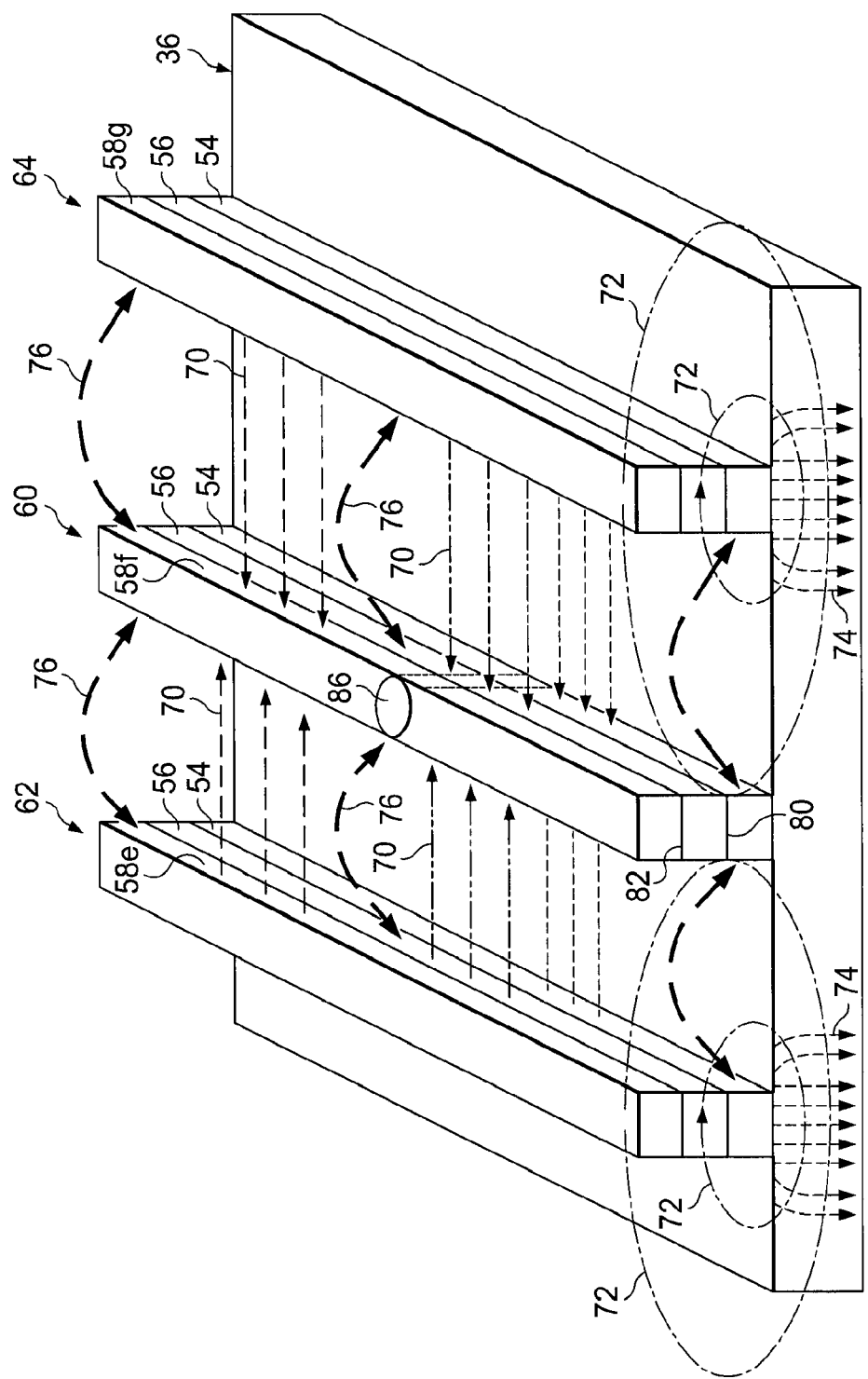
FIG. 4 illustrates the shield disposed between two adjacent passive circuit elements with a conductive via connecting the conductive layers to ground.

FIG. 4 shows a 3D view of grounded shield 60 disposed between circuit patterns 62 and 64. In one example, shield 60 corresponds to conductive layers 54b, 56, and 58f. Circuit pattern 62 corresponds to a MIM capacitor like that formed in part by conductive layers 54b, 56, 58d, and 58e. Circuit pattern 64 corresponds to an inductor like that formed by conductive layers 58g and 58h. In this case, the metal layers forming the inductor reside over M-cap layer 54. Circuit patterns can also be resistors, active devices, and signal traces. Circuit patterns 62 and 64 each generate or induce cross-talk in the form of conductive coupling shown by arrow 70, magnetic field coupling shown by arrows 72, electric field coupling shown by arrows 74, or capacitive coupling shown by arrows 76. Shield 60 blocks the cross-talk generated by circuit patterns 62 and 64 and routes the coupling energy to ground through the conductive layers of shield 60.

In another embodiment, the conductive layers of grounded shield 60 are electrically isolated, i.e., an insulating layer 80 is disposed between M-cap layer 54 and conductive layer 56, and an insulating layer 82 is disposed between conductive layers 56 and 58f. The insulating layers 80 and 82 electrically isolate M-cap 54 and metal layers 56 and 58. The insulating layers can be made with SiO2, SiON, Ta2O5, ZnO, or other material having electrically insulating properties. A via 86 is formed through layers 54, 56, and 58f. The via is filled with a conductive material, e.g., Al, Cu, Sn, Ni, Au, or Ag, to electrically connect conductive layers 56 and 58f to M-cap 54, which in turn is connected to a low impedance ground point.

FIG. 5 is a top view of an IPD 90 isolated by ground shield 92. IPD 90 includes interconnect terminals 94 and 96 such as power and ground. Segments 98, 100, 102, and 104 of ground shield 92 are formed like shield 60 in FIG. 4. Segments 106, 108, 110, and 112 represent M-cap layer 54 which route the low impedance ground point to segments 98, 100, 102, and 104. Conductive vias 80 electrically connect segments 98, 100, 102, and 104 to the grounded M-cap layer 54.

FIG. 6 is a top view of IPDs 120, 122, and 124 isolated by ground shields 126, 128, 130, and 132. IPD 120 can be an inductor, IPD 122 can be a capacitor, and IPD 124 can be a resistor. IPD 120 includes interconnect terminals 134 and 136; IPD 122 includes interconnect terminals 138 and 140; IPD 124 includes interconnect terminals 142 and 144. The ground shield 126, 128, 130, and 132 are formed like shield 60 in FIG. 4. Segments 146, 148, 150, and 152 represent M-cap layer 54 which route the low impedance ground point to shields 126, 128, 130, and 132. Conductive vias 80 electrically connect shields 98, 100, 102, and 104 to grounded M-cap layer 54.

In summary, a semiconductor device includes a plurality of IPDs positioned in close proximity. Each IPD is isolated by a shield including a grounded M-cap layer, intermediate conductive layer, and top conductive layer. The grounded shield is made about the same height as the IPDs and isolates each IPD from cross-talk generated by the adjacent IPD. The grounded shield allows the IPDs to be located with minimal spacing, which saves space and cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a passive circuit over the substrate; and forming a shielding layer over the substrate adjacent to the passive circuit by,
(a) forming a first conductive layer over the substrate, and
(b) forming a second conductive layer with a major surface of the second conductive layer contacting a major surface of the first conductive layer.

2. The method of claim 1, wherein the shielding layer includes a height at least a height of the passive circuit.

3. The method of claim 1, wherein forming the passive circuit includes:
forming a third conductive layer over the substrate; and
forming a fourth conductive layer over the third conductive layer.

4. The method of claim 1, further including forming a conductive via through the first conductive layer and second conductive layer.

5. The method of claim 1, wherein the passive circuit is selected from the group consisting of a resistor, inductor, capacitor, and signal trace.

6. A method of making a semiconductor device, comprising:
providing a substrate;
forming an M-cap layer over the substrate;
forming a passive circuit over the substrate; and
forming a shielding layer over the M-cap layer adjacent to the passive circuit by,
(a) forming a first conductive layer over the M-cap layer,
(b) forming a second conductive layer contacting the first conductive layer, and
(c) forming a conductive via through the M-cap layer, first conductive layer, and second conductive layer.

7. The method of claim 6, wherein the shielding layer includes a height at least a height of the passive circuit.

8. The method of claim 6, wherein forming the passive circuit includes:
forming a third conductive layer over the substrate; and
forming a fourth conductive layer over the third conductive layer.

9. The method of claim 6, wherein the passive circuit is selected from the group consisting of a resistor, inductor, capacitor, and signal trace.

10. A semiconductor device, comprising:
a substrate;
a passive circuit formed over the substrate; and
a shielding layer formed over the substrate adjacent to the passive circuit, the shielding layer including,
(a) a first conductive layer formed over the substrate, and
(b) a second conductive layer with a major surface of the second conductive layer contacting a major surface of the first conductive layer.

11. The semiconductor device of claim 10, wherein the shielding layer includes a height at least a height of the passive circuit.

12. The semiconductor device of claim 10, wherein the passive circuit includes:
a third conductive layer formed over the substrate; and
a fourth conductive layer formed over the third conductive layer.

13. The semiconductor device of claim 10, further including a conductive via formed through the first conductive layer and second conductive layer.

14. A semiconductor device, comprising:
a substrate;
an M-cap layer formed over the substrate;
a passive circuit formed over the substrate; and
a shielding layer formed over the M-cap layer adjacent to the passive circuit, the shielding layer including,
(a) a first conductive layer formed over the M-cap layer,
(b) a second conductive layer contacting a surface of the first conductive layer, and
(c) a conductive via formed through the first conductive layer and second conductive layer.

15. The semiconductor device of claim 14, wherein the shielding layer includes a height at least a height of the passive circuit.

16. The semiconductor device of claim 14, wherein the passive circuit includes:
a third conductive layer formed over the substrate; and
a fourth conductive layer formed over the third conductive layer.

17. A semiconductor device, comprising:
a substrate;
a passive circuit formed over the substrate; and
a shielding layer formed over the substrate adjacent to the passive circuit, the shielding layer including,
(a) a first conductive layer formed over the substrate,
(b) a second conductive layer formed over the first conductive layer, and
(c) a conductive via formed through the first conductive layer and second conductive layer.

18. The semiconductor device of claim 17, wherein the passive circuit includes:
a third conductive layer formed over the substrate; and
a fourth conductive layer formed over the third conductive layer.

19. The semiconductor device of claim 17, further including an insulating layer formed between the first conductive layer and second conductive layer.

20. The semiconductor device of claim 17, wherein the passive circuit is selected from the group consisting of a resistor, inductor, capacitor, and signal trace.

* * * * *